United States Patent [19]

Mittel

[11] Patent Number: 5,630,228
[45] Date of Patent: May 13, 1997

[54] DOUBLE BALANCED MIXER CIRCUIT WITH ACTIVE FILTER LOAD FOR A PORTABLE COMUNICATION RECEIVER

[75] Inventor: James G. Mittel, Boynton Beach, Fla.

[73] Assignee: Motorola, Inc., Schaumburg, Ill.

[21] Appl. No.: 427,026

[22] Filed: Apr. 24, 1995

[51] Int. Cl.$^6$ ............................................. H04B 1/16
[52] U.S. Cl. .................... 455/326; 455/333; 455/343;
                                    327/120; 327/359
[58] Field of Search ........................ 455/318–320,
                        455/324, 323, 325, 326, 330, 333, 343;
                        327/359, 120, 121

[56] References Cited

U.S. PATENT DOCUMENTS

| | | |
|---|---|---|
| 4,025,720 | 5/1977 | Pachynski, Jr. . |
| 4,431,970 | 2/1984 | Sumi et al. . |
| 4,605,903 | 8/1986 | Ihle . |
| 4,776,039 | 10/1988 | Akaiwa . |
| 5,532,637 | 7/1996 | Khoury et al. ............ 455/333 |

FOREIGN PATENT DOCUMENTS

| | | |
|---|---|---|
| 0336191 | 10/1989 | European Pat. Off. . |
| 59-191907 | 10/1984 | Japan . |
| 2243965 | 11/1991 | United Kingdom . |

OTHER PUBLICATIONS

"All Current–Mode Frequency Selective Circuits", Electronics Letters 8th Jun. 1989 vol. 25 No. 12 pp. 759–761.

*Primary Examiner*—Chi H. Pham
*Attorney, Agent, or Firm*—D. Andrew Floam

[57] ABSTRACT

A double balanced mixer circuit (50) having a multiplication circuit (10) and an active filter circuit (30) coupled to the multiplication circuit (10). The active filter circuit (30) has a common-base differential amplifier (32) coupled to the differential outputs (52,54) of the multiplication circuit (10) and generates differential current outputs in response to the differential output current signal of the multiplication circuit (10), and a differential second order low pass active filter (34) coupled to the common-base differential amplifier (32) for filtering the differential current outputs of the common-base differential amplifier (32) and generating a filtered differential mixer output signal. A single direct current source coupled to the multiplication circuit (10) is also used to bias the active filter circuit (30). The mixer circuit (50) has utility in a non-differential mode as well as a fully differential mode.

15 Claims, 7 Drawing Sheets

DOUBLE BALANCED MIXER CIRCUIT WITH ACTIVE FILTER LOAD FOR A PORTABLE COMUNICATION RECEIVER

FIELD OF THE INVENTION

This invention relates in general to the field of a portable communication receiver, and more particularly to a mixer circuit for minimizing the current drain of the receiver.

BACKGROUND OF THE INVENTION

A portable communication receiver includes receiver circuitry for demodulating a received radio frequency signal. One type of receiver circuitry is called a "ZERO-IF" circuit, which is a low cost radio receiver. Most implementations of a ZERO-IF circuit include double balanced mixers followed by integrated low pass channel filters. Noise and dynamic range limitations typically force high current drain in the mixer and in the initial stages of a baseband channel filter. In addition, the second order input stage of each baseband filter consumes considerable current.

It is desirable to minimize current drain in these stages without compromising noise figure or selectivity.

DETAILED DESCRIPTION OF THE DRAWINGS

Figure 1:
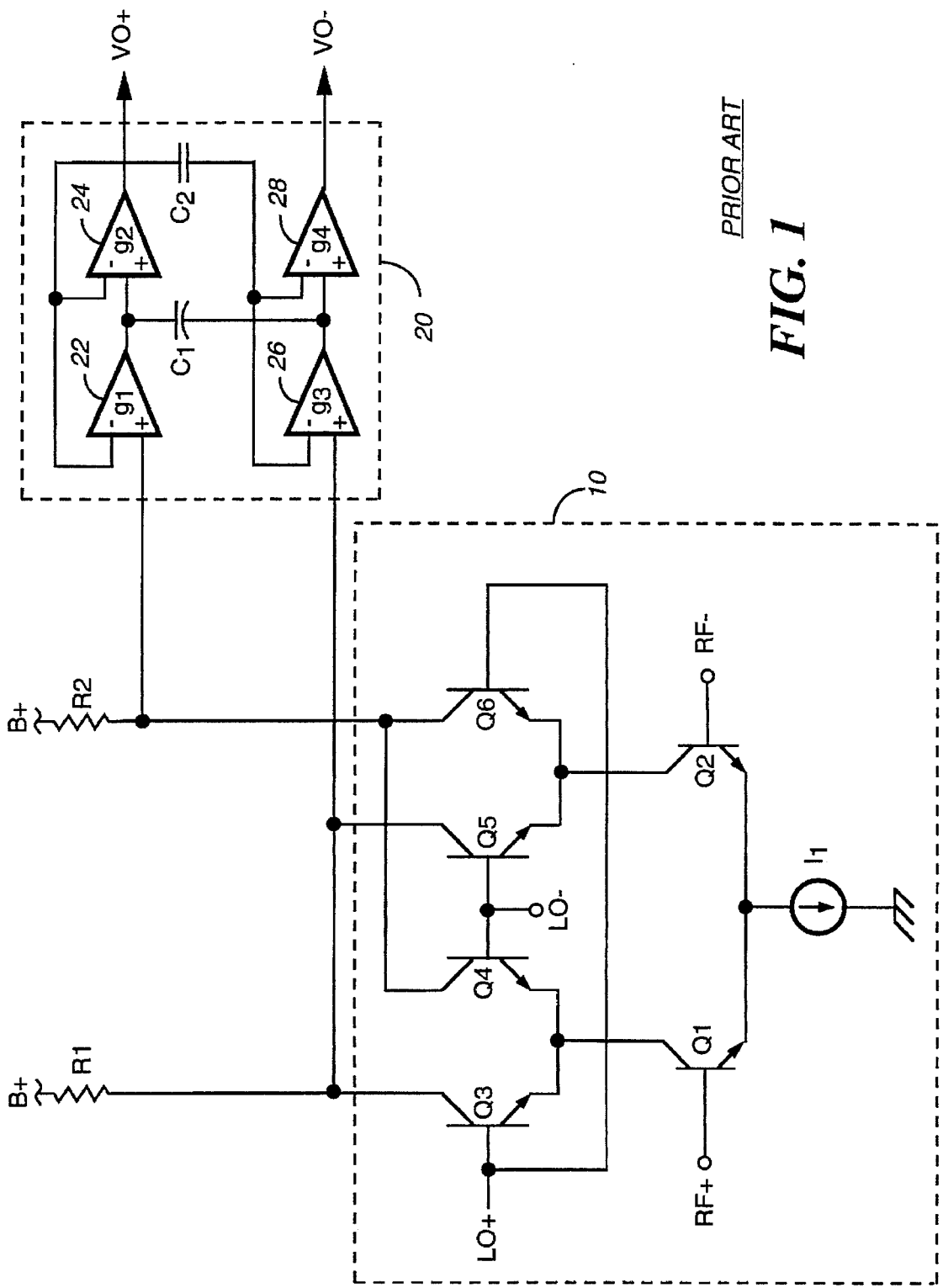
FIG. 1 is an electrical schematic diagram of a prior art double balanced mixer stage having coupled at its output an active low pass filter stage.

FIG. 1 illustrates a prior art double balanced mixer circuit 8 which comprises a multiplication circuit 10 followed by an active low pass filter stage 20. The multiplication circuit 10 comprises a differential amplifier formed by transistors Q1 and Q2. A direct current (DC) current source I1 is coupled to the emitters of the transistors Q1 and Q2 and sets the operating point bias for the circuit. The bases of transistors Q1 and Q2 are the differential inputs of the mixer 8 and receive the differential radio frequency (RF) input signal (RF+/RF−) to be mixed by the mixer circuit 8. The current source I1 is 200 µA in this example.

Transistors Q3, Q4, Q5 and Q6 form a common base switching network driven by a differential local oscillator signal (LO+/LO−). The bases of transistors Q3, Q4, Q5 and Q6 are the differential local oscillator signal inputs such that LO+ is coupled to transistors Q3 and Q6 and LO− is coupled to transistors Q4 and Q5. The emitters of transistors Q3 and Q4 are coupled together and the emitters of transistors Q5 and Q6 are coupled together. The collectors of transistors Q3 and Q5 are coupled to a voltage supply B+ via resistor R1. The collectors of transistors Q4 and Q6 are coupled to the voltage supply B+ via resistor R2. The collector of transistor Q1 is coupled to the emitters of transistors Q3 and Q4 and the collector of transistor Q2 is coupled to the emitters of transistors Q5 and Q6.

The common base switching network steers the collector currents of transistors Q1 and Q2 to achieve a desired multiplication function associated with all mixers. Resistors R1 and R2 serve as a resistive load which converts the output current into a voltage suitable for driving the next stage.

The active filter circuit 20 comprises transconductance amplifiers 22, 24, 26 and 28 with respective gains of g1, g2, g3 and g4. The transconductance amplifiers 22, 24, 26 and 28 each have a inverting (−) and non-inverting (+) input. The collectors of transistors Q3 and Q5 are coupled to the non-inverting input of transconductance amplifier 26 and the collectors of transistors Q4 and Q6 are coupled to the non-inverting input of transconductance amplifier 22. Capacitors C1 and C2 are coupled between the amplifiers as shown and form a differential version of the well known Sallen and Key second order low pass filter. The output of the prior art double balanced mixer circuit 8 is generated as a differential output (Vo+,Vo−) consisting of the output of the transconductance amplifier 24 and the transconductance amplifier 28.

Figure 2:
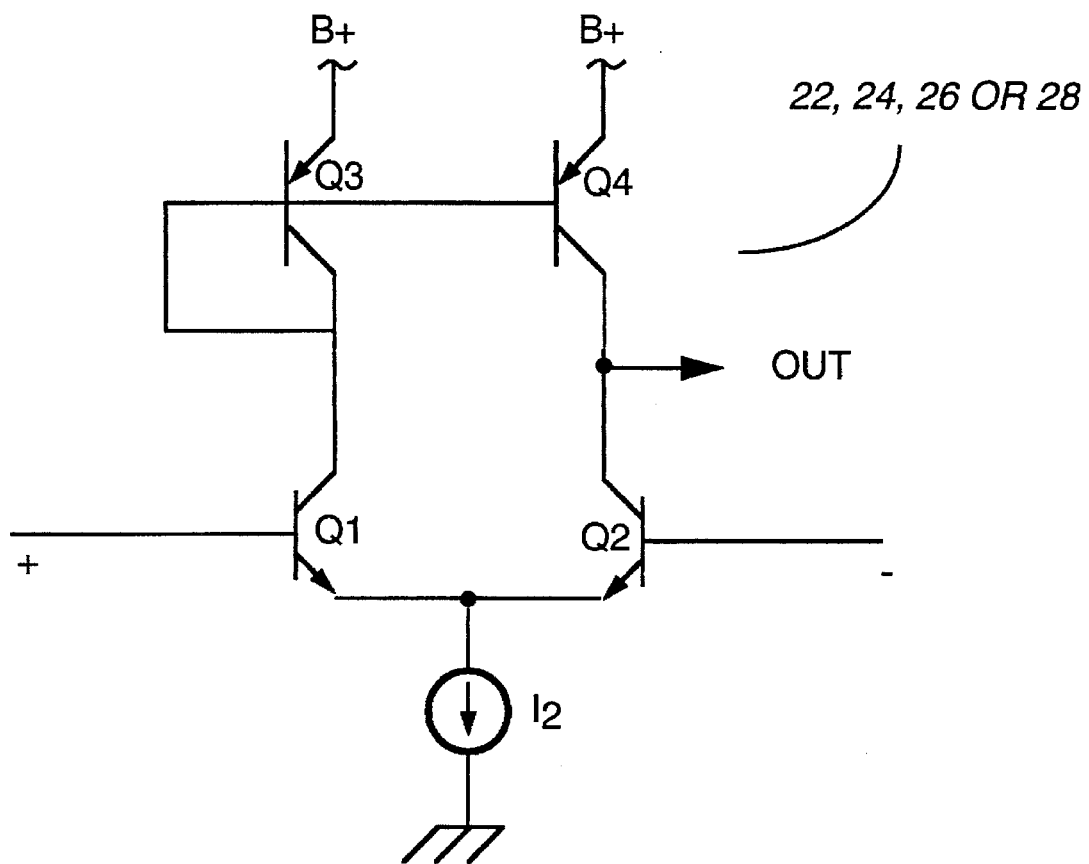
FIG. 2 is an electrical schematic diagram of a conventional transconductance amplifier as used in the circuit shown in FIG. 1.

An example of a transconductance amplifier 22, 24, 26 or 28 is shown in FIG. 2. Current source I2 is a DC current source that directly biases and tunes the transconductance of the amplifier. Transistors Q1 and Q2 form a differential amplifier driven by the input signal. PNP transistors Q3 and Q4 form a current mirror load referenced to the voltage supply B+. The output of the transconductance amplifier is the difference in the collector currents of transistors Q2 and Q4. The transconductance, G, of this amplifier design is determined by the expression $I1/(2*Vt)$, where $Vt=K*T/Q$, and K is Boltzman's constant, T is the absolute temperature, and Q is the charge on an electron. In this example, a current drain of 33 µA is required for each of the four transconductance amplifiers. Accordingly, at least an additional 130 µA is needed to bias the four transconductance amplifiers.

Thus, this example of the entire mixer circuit 8 consumes 200 µA in the multiplication circuit and an additional 130 µA in the following active filter circuit. Moreover, the linear dynamic range of the transconductance amplifier used in the low pass filter is a limiting factor in the large signal handling capability of the design.

Figure 3:
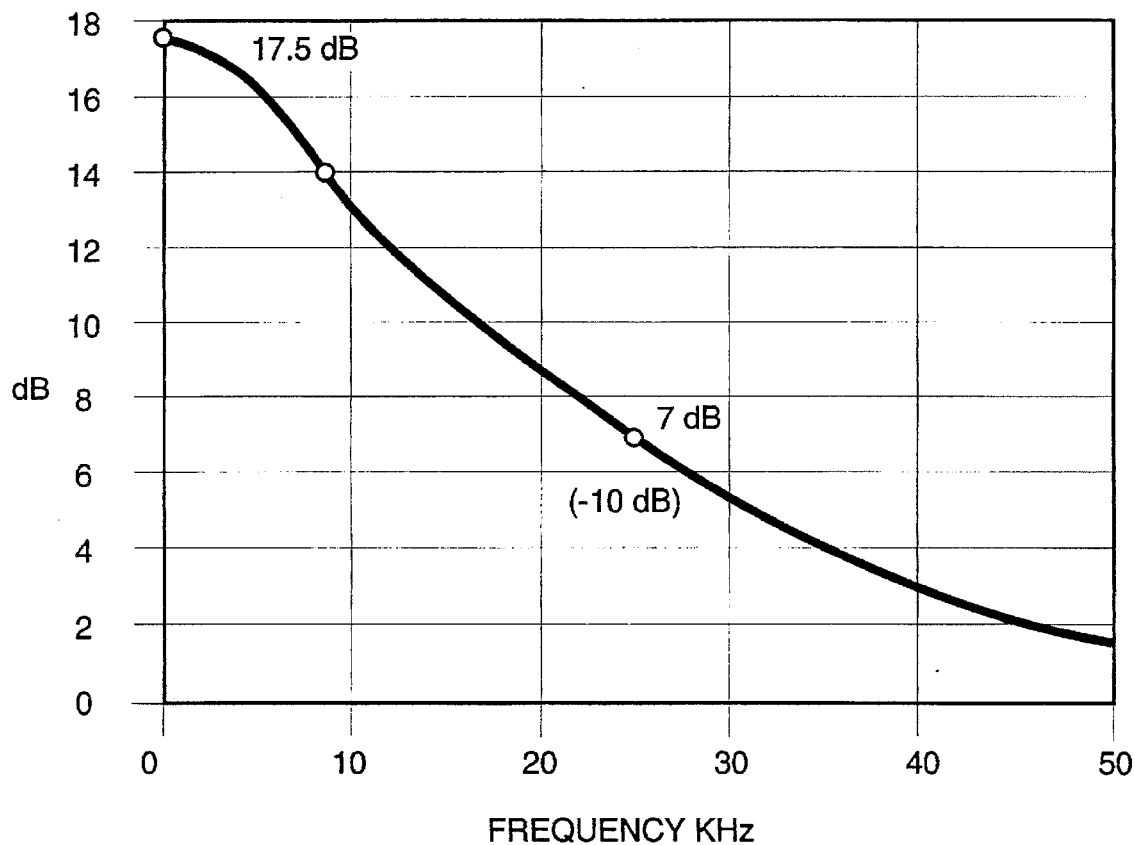
FIG. 3 is a frequency plot diagram showing the frequency response of the circuit shown in FIG. 1.

FIG. 3 illustrates the frequency response of the circuit shown in FIG. 1, with the output taken at Vo+,Vo− and the input at RF+,RF−. The plot shows that there is approximately 10.5 dB of rejection at the 25 kHz adjacent channel frequency.

Figure 4:
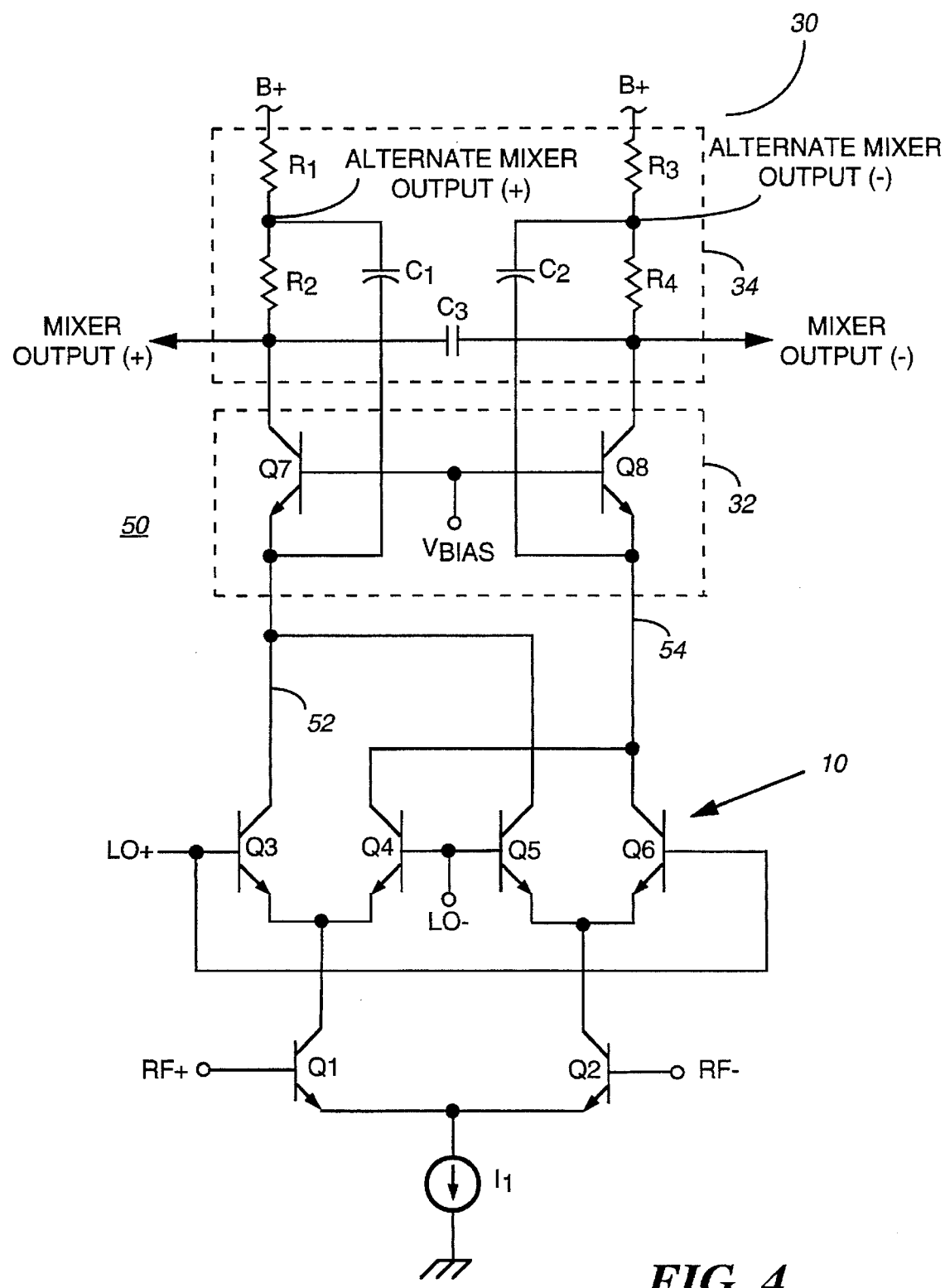
FIG. 4 is an electrical schematic diagram of a double balanced mixer with active load according to the present invention.

FIG. 4 illustrates the double balanced mixer circuit 50 according to the present invention. The multiplication circuit 10 comprising current source I1 and transistors Q1–Q6 is the same as that shown in FIG. 1. A differential output current that is the product of the RF and LO input signals is generated by the multiplication circuit 10 and is provided at the first and second differential outputs 52 and 54, respectively. The collectors of transistors of transistors Q3 and Q5 are coupled to the first differential output 52 and the collectors of transistors Q4 and Q6 are coupled to the second differential output 54.

The active filter circuit 30 comprises a common-base differential amplifier 32 that provides a low impedance load. The common-base differential amplifier 32 comprises transistors Q7 and Q8 A voltage bias source Vbias is coupled to the bases of transistors Q7 and Q8. The emitter of transistor Q7 is coupled to the collectors of transistors Q3 and Q5 and the emitter of transistor Q8 is coupled to the collectors of transistors Q4 and Q6. The amplifier 32 functions as a unity gain current controlled current source which generates a differential current output at the collectors of transistors Q7 and Q8, respectively in response to the differential output current of the multiplication circuit 10.

A differential second order current-mode Sallen and Key based, low pass active filter 34 is formed by resistors R1–R4 and capacitors C1–C3 coupled to the collectors and emitters of transistors Q7 and Q8. Resistors R1 and R2 are connected in series and resistor R2 is coupled to the collector of transistor Q7. Resistor R1 is connected to a bias voltage B+. Capacitor C1 is coupled between the emitter of transistor Q7 and a node between resistors R1 and R2. Resistors R3 and R4 are connected in series and resistor R4 is coupled to the collector of transistor Q8. Resistor R3 is connected to bias voltage B+. Capacitor C2 is coupled between the emitter of transistor Q8 and a node between resistors R3 and R4.

In operation, the local oscillator signal (LO+,LO−) is coupled to the bases of transistors Q3,Q6 and Q4,Q5, and the RF signal to be mixed (RF+,RF−) is coupled to the bases of transistors Q1 and Q2. The output of the double balanced mixer circuit 50 is taken at opposite ends of capacitor C3 as shown in FIG. 4 by MIXER OUTPUT (+) and MIXER OUTPUT (−). The differential second order low pass active filter filters the differential current output of the common-base differential amplifier 32 and generates a filtered differential mixer output signal.

The entire double balanced mixer circuit 50 comprising the multiplication circuit 10 and the active filter circuit 30 consumes only 200 µA. The active filter circuit 30 is driven by the same current source I1 as the multiplication circuit 10, thereby enabling large signal handling capability of the circuit. Thus, whereas the prior art circuit of FIG. 1 includes an active filter circuit 20 which requires a current source I2 for each transconductance amplifier in the active filter circuit 20 (FIG. 2), the mixer circuit 50 according to the present invention uses a single current source for both the multiplication circuit 10 and the active filter circuit 30.

Figure 5:
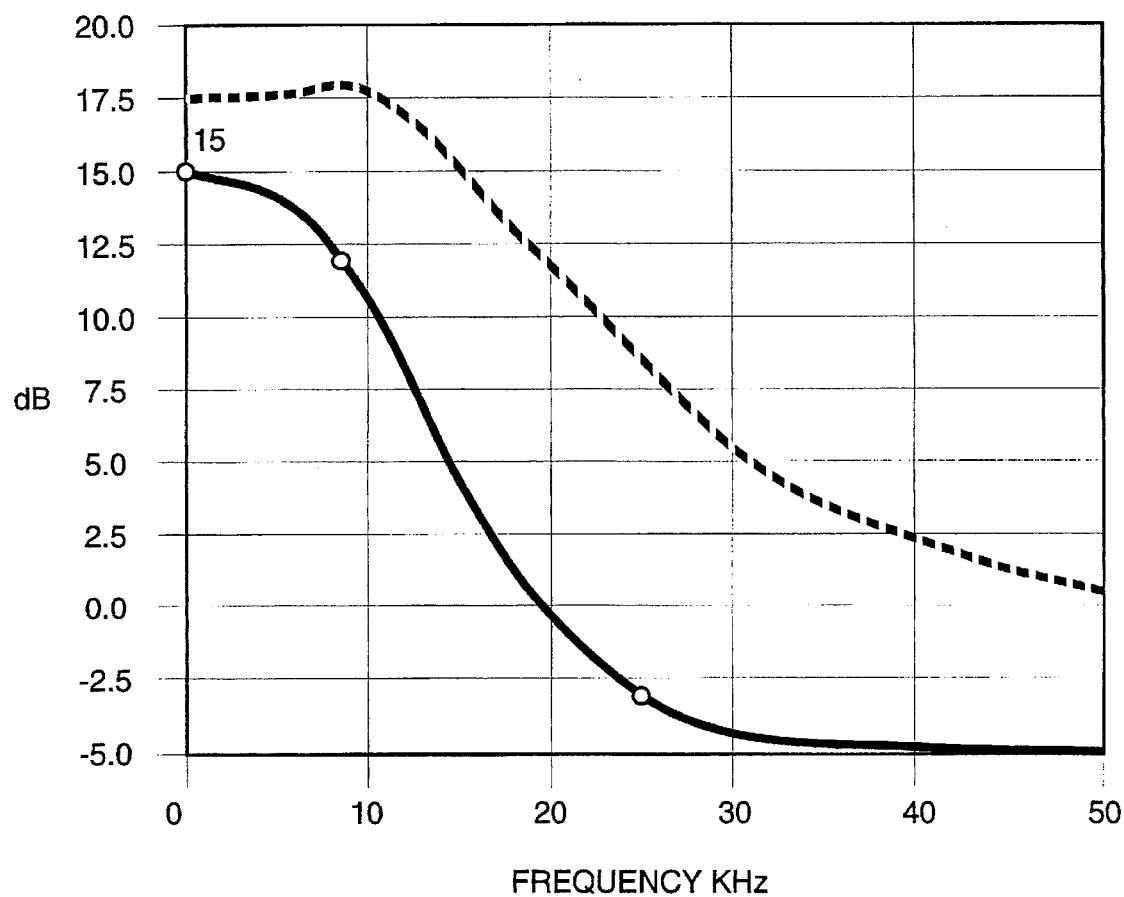
FIG. 5 is a frequency response plot of the circuit shown in FIG. 4.

FIG. 5 illustrates the frequency response of the circuit 50 according to the present invention, with component values optimized to provide more gain and an improved response shape at the alternate node outputs. Specifically, the values used in the low pass active filter 34 to achieve the results shown in FIG. 5 are:

| R1, R3 | 1.5K | C1, C2 | 28 nF |
| R2, R4 | 500  | C3     | 5 nF  |

Approximately 17.5 dB of attenuation in the adjacent channel frequency is obtained, which is 7 dB improvement over the prior art circuit, and as shown in FIG. 5, the double balanced mixer circuit 50 according to the present invention has a good passband shape. The dotted trace in FIG. 5 represents the response when the output is taken at the mixer outputs noted FIG. 4. The solid trace in FIG. 5 corresponds to the response of the circuit when the output is taken at the node between resistors R1 and R2, and the node between resistors R3 and R4, called ALTERNATE MIXER OUTPUT (+) and ALTERNATE MIXER OUTPUT(−). Taking the output of the mixer circuit 50 from the ALTERNATE MIXER OUTPUTs achieves better rejection as FIG. 5 illustrates.

It is appreciated by those with ordinary skill in the art that although the foregoing description is made in connection with a fully differential circuit configuration, the present invention has utility in a non-differential mode. Referring again to FIG. 4, the negative or minus (−) nodes of the local oscillator signal input (LO−), RF signal input (RF−) are optionally tied a DC bias source or ground, as appropriate. Nevertheless, the output of the multiplication circuit 10 may still be differential (for better performance). Indeed, the entire circuit can be implemented in a non-differential mode such that the output 52 is the only output of the multiplication circuit. Thus, the entire right half of the circuit is effectively absent in a non-differential mode, the common-base amplifier 32 would comprise transistor Q7 and active filter circuit 34 would comprise resistors R1 and R2, and capacitors C1 and C3. The output of the mixer circuit 50 is only MIXER OUTPUT (+) and MIXER OUTPUT (−) is optionally grounded, thus grounding that node of the capacitor C3.

Figure 6:
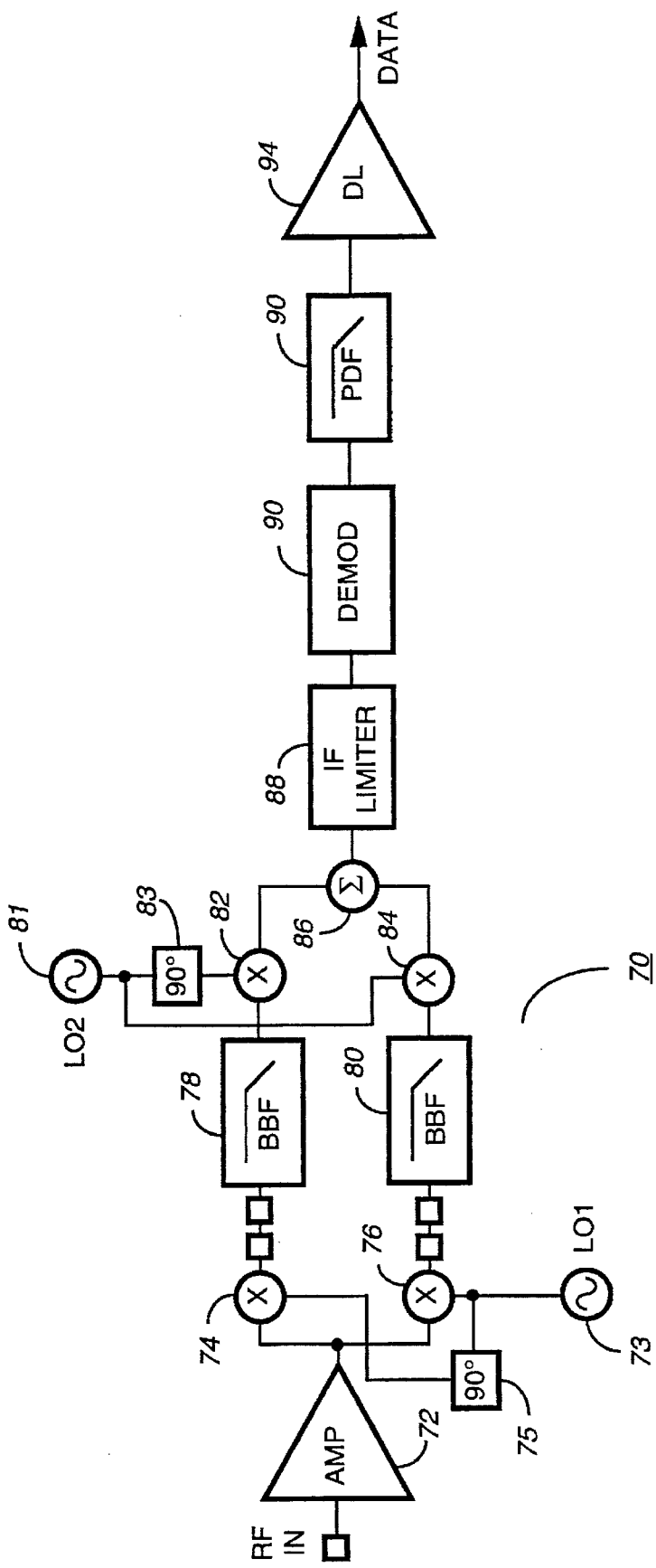
FIG. 6 is an electrical block diagram of a zero-intermediate frequency receiver circuit according to the present invention.

FIG. 6 illustrates a zero-intermediate frequency ("zero-IF") circuit 70 featuring the double balanced mixer circuit 50 of the present invention. The zero-IF circuit 70 is an example of a receiver circuit utilizing the double balanced mixer circuit 50 according to the present invention. The double balanced mixer circuit 50 has utility in other receiver circuits as well.

The zero-IF circuit 70 comprises a radio frequency (RF) amplifier 72 which receives as input an RF signal detected by an antenna (not shown) and amplifies the detected RF signal to generate an amplified RF signal. The amplified RF signal is divided into two channels for processing, one representing an in-phase or "I" channel and one representing a quadrature phase or "Q" channel. A local oscillator LO1 provides a first local oscillator signal which is phase shifted by the 90 degree phase shifter 75 and coupled to mixers 74 and 76. Mixers 74 and 76 preferably comprise the double balanced mixer circuit 50 according to the present invention.

The output of the mixers 74 and 76 are coupled to base band filters (BBF's) 78 and 80, respectively, which are in turn coupled to mixers 82 and 84. A second local oscillator LO2 and a second phase shifter 83 drive the mixers 82 and 84.

A summing circuit 86 adds the outputs of the mixers 82 and 84 to generate a sum signal which is passed through an IF limiter 88. The output of the IF limiter 88 is processed by a demodulator 90. The output of the demodulator is coupled to a post detection filter (PDF) 92 which generates a recovered audio signal at its output. Ultimately, the recovered audio signal is passed through a data limiter 94 to generate data contained in the received RF signal.

Figure 7:
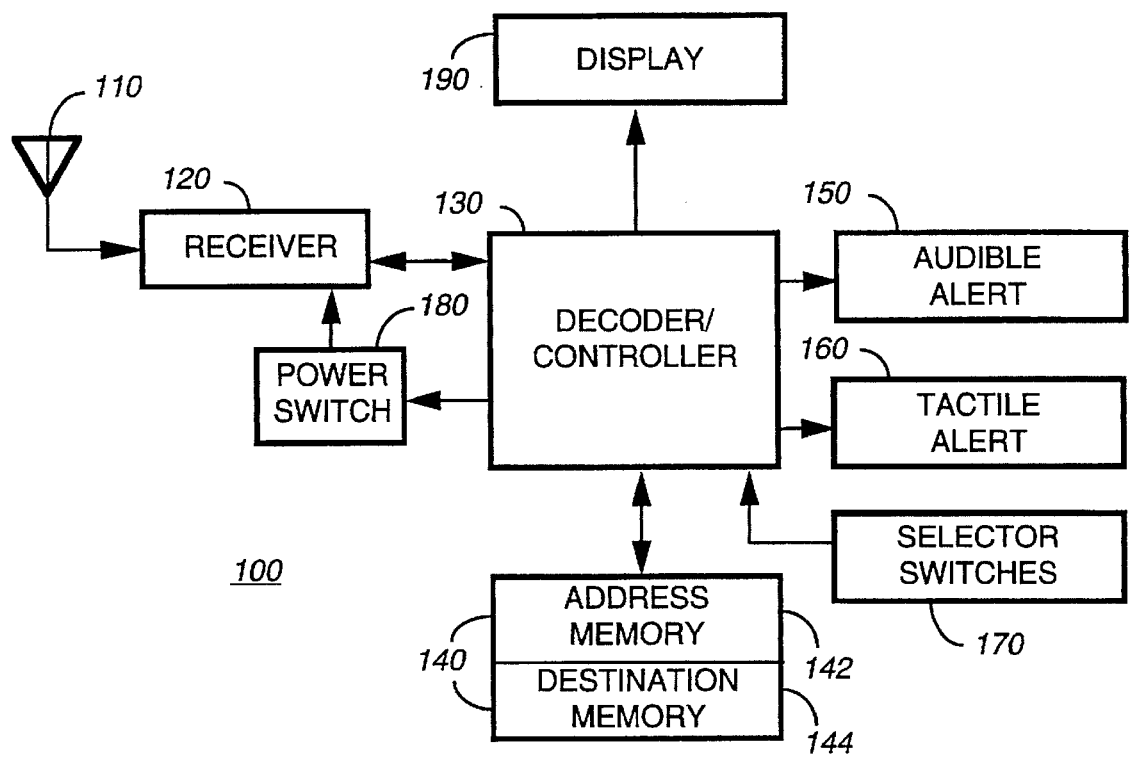
FIG. 7 is an electrical block diagram a selective call receiver according to the present invention.

Referring to FIG. 7, a selective call receiver 100 is shown. The selective call receiver 100 comprises an antenna 110, a receiver 120, a decoder/controller 130, and a code plug memory 140 including an address memory 142 and a destination memory 144. The code plug memory 140 is programmable by a remote programming device, as is well known in the art. In addition, various alert devices are provided, such as the tactile alert 160 and the audible alert 150. A power switch 180 is also provided to activate and de-activate certain components of the selective call receiver 100 under control of the decoder/controller 130. The receiver 120 includes, for example, the zero-IF receiver circuit 70 or another receiver circuit, including the double balanced mixer circuit 50 according to the present invention.

User input into the selective call receiver is by way of selector switches 170. A menu of various user programmable features is accessed via the switches, through the use of menu information displayed on the display 190. The selector switches 170 allow, for example, "up" or "down" adjustment of user programmable features.

What is claimed is:

1. A mixer circuit comprising:

a multiplication circuit having a first input suitable for connection to an oscillator signal and a second input suitable for connection to a radio frequency (RF) signal to be mixed with the oscillator signal, the multiplication circuit generating at an output an output current which is a multiplication of the oscillator signal and the RF signal;

a direct-current (DC) current source coupled to the multiplication circuit for supplying DC current for operation of the multiplication circuit;

an active filter circuit coupled to the multiplication circuit, the active filter circuit being biased for operation by DC current that is coupled to it through the output of the multiplication circuit from the DC current source, the active filter circuit comprising:

a common-base amplifier coupled to the output of the multiplication circuit and generating a current output in response to the output current of the multiplication circuit, wherein the common-base amplifier comprises a voltage bias, a first transistor comprising an emitter, base and collector, the emitter of the first transistor coupled to the output of the multiplication circuit, the DC current being coupled to the active filter circuit through the emitter of the first transistor, and the base of the first transistor coupled to the voltage bias; and a low pass active filter coupled to the common-base amplifier for filtering the current output of the common-base amplifier and generating at an output a filtered mixer output signal.

2. The mixer circuit of claim 1, wherein the low pass active filter is a second order Sallen and Key filter which comprises:

first and second resistors connected in series and coupled between the collector of the first transistor of the common-base amplifier and a voltage supply;

a first capacitor coupled between the emitter of the first transistor of the common-base amplifier and a node between the first and second resistors; and a second capacitor coupled to the collector of the first transistor of the common-base amplifier.

3. A receiver circuit comprising the mixer circuit of claim 1.

4. A selective call receiver comprising the receiver circuit of claim 3.

5. A mixer circuit comprising:

a multiplication circuit having a first input suitable for connection to an oscillator signal and a second input suitable for connection to a radio frequency (RF) signal to be mixed with the oscillator signal, the multiplication circuit generating at first and second differential outputs an output current which is a multiplication of the oscillator signal and the RF signal;

a direct-current (DC) current source coupled to the multiplication circuit for supplying DC current for operation of the multiplication circuit;

an active filter circuit coupled to the multiplication circuit, the active filter circuit being biased for operation by DC current that is coupled to it through the output of the multiplication circuit from the DC current source, the active filter circuit comprising:

a common-base amplifier coupled to the output of the multiplication circuit and generating a current output in response to the output current of the multiplication circuit, the common-base amplifier being a differential common-base amplifier comprising:

a voltage bias; and first and second transistors each comprising an emitter, base and collector, the emitter of the first transistor coupled to the first differential output of the multiplication circuit and the emitter of the second transistor coupled to the second differential output of the multiplication circuit, the DC current being coupled to the active filter circuit through the emitters of the first and second transistors, and the bases of the first and second transistors being coupled to the voltage bias; and a low pass active filter coupled to the common-base amplifier for filtering the current output of the common-base amplifier and generating at an output a filtered mixer output signal.

6. The mixer circuit of claim 5, wherein the low pass active filter is a differential second order Sallen and Key filter which comprises:

a voltage supply;

first and second resistors connected in series and coupled between the collector of the first transistor of the common-base amplifier and the voltage supply;

third and fourth resistors connected in series and coupled between the collector of the second transistor of the common-base amplifier and the voltage supply;

a first capacitor coupled between the emitter of the first transistor of the common-base differential amplifier and a node between the first and second resistors;

a second capacitor coupled between the emitter of the second transistor of the common-base amplifier and a node between the third and fourth resistors; and a third capacitor coupled between the collectors of the first and second transistors.

7. The mixer circuit of claim 6, wherein the filtered mixer output signal at the output of the low pass active filter comprises a differential voltage at opposite ends of the third capacitor.

8. The mixer circuit of claim 6, wherein the filtered mixer output signal at the output of the low pass active filter comprises a differential voltage at the node between the first and second resistors, and the node between the third and fourth resistors, respectively.

9. A receiver circuit suitable for connection to an antenna for receiving a radio frequency (RF) signal detected by the antenna, the receiver circuit comprising:

an amplifier for amplifying the RF signal detected by the antenna and generating an amplified RF signal;

at least one local oscillator for generating a local oscillator signal;

at least one mixer coupled to the at least one local oscillator and to an output of the amplifier, the at least one mixer comprising:

a multiplication circuit having a first input coupled to the local oscillator signal and a second input coupled to the amplified RF signal, the multiplication circuit generating at an output an output current which is a multiplication of the local oscillator signal and the amplified RF signal;

a direct-current (DC) current source coupled to the multiplication circuit for supplying DC current for operation of the multiplication circuit;

an active filter circuit coupled to the multiplication circuit, the active filter circuit being biased for operation by DC current that is coupled to it through the output of the multiplication circuit from the DC current source, the active filter circuit comprising:

a common-base amplifier coupled to the output of the multiplication circuit and generating a current output in response to the output current of the multiplication circuit, wherein the common-base amplifier comprises a voltage bias, a first transistor comprising an emitter, base and collector, the emitter of the first transistor coupled to the output of the multiplication circuit, the DC current being coupled to the active filter circuit through the emitter of the first transistor, and the base of the first transistor coupled to the voltage bias;

a low pass active filter coupled to the common-base amplifier for filtering the current output of the common-base amplifier and generating at an output a filtered mixer output signal; and a demodulator coupled to an output of the at least one mixer for demodulating the filtered mixer output signal to generate a recovered audio signal.

10. A selective call receiver comprising the receiver circuit of claim 9, and further comprising:

a data limiter coupled to the demodulator for receiving the recovered audio signal and for generating a digital signal representative of a selective call signal;

a code plug memory for storing an address of the selective call receiver; and a decoder/controller connected to the data limiter and the code plug memory and responsive to the digital signal to generate an alert based on the digital signal and the address stored in the code plug memory.

11. The receiver circuit of claim 9, wherein the low pass active filter is a second order Sallen and Key filter which comprises:

first and second resistors connected in series and coupled between the collector of the first transistor of the common-base amplifier and a voltage supply;

a first capacitor coupled between the emitter of the first transistor of the common-base amplifier and a node between the first and second resistors; and a second capacitor coupled to the collector of the first transistor of the common-base amplifier.

12. A receiver circuit suitable for connection to an antenna for receiving a radio frequency (RF) signal detected by the antenna, the receiver circuit comprising:

an amplifier for amplifying the RF signal detected by the antenna and generating an amplified RF signal;

at least one local oscillator for generating a local oscillator signal;

at least one mixer coupled to the at least one local oscillator and to an output of the amplifier, the at least one mixer comprising:

a multiplication circuit having a first input coupled to the local oscillator signal and a second input coupled to the amplified RF signal, the multiplication circuit generating at first and second differential outputs an output current which is a multiplication of the local oscillator signal and the amplified RF signal;

a direct-current (DC) current source coupled to the multiplication circuit for supplying DC current for operation of the multiplication circuit;

an active filter circuit coupled to the multiplication circuit, the active filter circuit being biased for operation by DC current that is coupled to it through the output of the multiplication circuit from the DC current source, the active filter circuit comprising:

a common-base amplifier coupled to the output of the multiplication circuit and generating a current output in response to the output current of the multiplication circuit, the common-base amplifier being a differential common-base amplifier comprising:

a voltage bias; and first and second transistors each comprising an emitter, base and collector, the emitter of the first transistor coupled to the first differential output of the multiplication circuit and the emitter of the second transistor coupled to the second differential output of the multiplication circuit, the DC current being coupled to the active filter circuit through the emitters of the first and second transistors, and the bases of the first and second transistors being coupled to the voltage bias;

a low pass active filter coupled to the common-base amplifier for filtering the current output of the common-base amplifier and generating at an output a filtered mixer output signal; and a demodulator coupled to an output of the at least one mixer for demodulating the filtered mixer output signal to generate a recovered audio signal.

13. The receiver circuit of claim 12, wherein the low pass active filter is a differential second order Sallen and Key filter which comprises:

a voltage supply;

first and second resistors connected in series and coupled between the collector of the first transistor of the common-base amplifier and the voltage supply;

third and fourth resistors connected in series and coupled between the collector of the second transistor of the common-base amplifier and the voltage supply;

a first capacitor coupled between the emitter of the first transistor of the common-base differential amplifier and a node between the first and second resistors;

a second capacitor coupled between the emitter of the second transistor of the common-base amplifier and a node between the third and fourth resistors; and a third capacitor coupled between the collectors of the first and second transistors.

14. The receiver circuit of claim 13, wherein the filtered mixer output signal at the output of the low pass active filter comprises a differential voltage at opposite ends of the third capacitor.

15. The receiver circuit of claim 13, wherein the filtered mixer output signal at the output of the low pass active filter comprises a differential voltage at the node between the first and second resistors, and the node between the third and fourth resistors, respectively.

* * * * *